United States Patent
Ricketson

(10) Patent No.: US 7,302,755 B2
(45) Date of Patent: Dec. 4, 2007

(54) HEAD ASSEMBLY FOR A COMPONENT MOUNTER

(75) Inventor: Tommy Howard Ricketson, Plumsteadville, PA (US)

(73) Assignee: Samsung Techwin Co., Ltd., Changwon (KR)

( * ) Notice: Subject to any disclaimer, the term of this patent is extended or adjusted under 35 U.S.C. 154(b) by 385 days.

(21) Appl. No.: 11/052,271

(22) Filed: Feb. 7, 2005

(65) Prior Publication Data

US 2006/0196046 A1 Sep. 7, 2006

(51) Int. Cl.
*B23P 19/00* (2006.01)

(52) U.S. Cl. .............................. 29/743; 29/740; 29/741; 29/742; 29/834; 414/757; 414/758; 294/64.1

(58) Field of Classification Search .................. 29/740, 29/743, 832, 833, 742, 834; 83/469; 414/64.1
See application file for complete search history.

(56) References Cited

U.S. PATENT DOCUMENTS 4,706,379 A * 11/1987 Seno et al. ................... 29/740
5,033,185 A * 7/1991 Hidese ........................ 29/740
5,070,598 A * 12/1991 Itagaki et al. ................ 29/705
5,086,556 A * 2/1992 Toi ............................. 29/740
5,255,903 A * 10/1993 Parsons et al. .......... 271/10.12

FOREIGN PATENT DOCUMENTS

JP      2003-273582 A      9/2003

* cited by examiner

*Primary Examiner*—Minh Trinh
*Assistant Examiner*—Tai Van Nguyen
(74) *Attorney, Agent, or Firm*—Drinker Biddle & Reath LLP

(57) ABSTRACT

Provided is a component mounter having a plurality of revolving nozzle spindles, which can simultaneously pick up and mount two or more electronic components. A head assembly for the component mounter includes: a base frame; a rotary housing rotatably mounted on the base frame and having spindle receiving holes vertically formed at regular intervals at the same radius from a center thereof; a plurality of nozzle spindles having lower ends to which nozzles for picking up electronic components are coupled, and received in the spindle receiving holes such that the plurality of nozzle spindles rotate on the same axis when the rotary housing rotates; a housing rotating mechanism rotating the rotary housing; and a nozzle lifting mechanism including a nozzle lift driving unit, and a clutch part that moves according to the operation of the nozzle lift driving unit and can simultaneously press down and lower the plurality of nozzle spindles.

20 Claims, 12 Drawing Sheets

HEAD ASSEMBLY FOR A COMPONENT MOUNTER

BACKGROUND OF THE INVENTION

1. Field of the Invention

The present invention relates generally to a component mounter, and more particularly to a head assembly for a component mounter.

2. Description of the Related Art

As is known in the surface mount technology (SMT) art, a component mounter receives various components from a component supplier, feeds the received components to certain positions of a printed circuit board (PCB), and mounts the components on the PCB.

In general a component mounter includes: a component supplying part that supplies electronic components to be mounted, a conveyor part that carries a PCB on which the electronic components are to be mounted, and a head assembly that successively picks up the electronic components from the component supplying part and mounts the electronic components on the PCB.

Recently, a plurality of nozzle spindles installed on a head assembly of the component mounter is provided to either successively or simultaneously pick up a plurality of electronic components, move the plurality of electronic components to a conveyor part simultaneously, and either successively or simultaneously mount the plurality of components on a PCB in an effort to improve the efficiency of a component mounter.

However, by increasing the component mounter's efficiency through increasing the number of nozzle spindles, the total size of the head assembly increases as well. Therefore, there is a trade-off in increasing the number of nozzle spindles installed on the head assembly.

Various known component mounters attempt to increase mounting efficiency without unduly increasing the size of the head assembly. For example, as illustrated in FIG. 1, a head part 10 disposed on a component mounter disclosed in Japanese Patent Laid-Open Publication No. hei 2003-273582 includes three revolving head assemblies 11 that are aligned. A number of nozzle spindles 40 are disposed in a generally circular arrangement in each head assembly 11 so that the spindles 40 of each head assembly 11 are rotated about a common vertical central axis by a corresponding nozzle rotating mechanism 60. Pickup nozzles 50 are coupled to lower portions of the nozzle spindles 40. The nozzle spindles 40 of the respective head assemblies 11 are selected by nozzle selecting mechanisms 70, and lowered by nozzle lifting mechanisms 80. The head assemblies 11 are fixed to a head frame 12.

The head assemblies 11 of the component mounter 10 will be described in further detail with reference to FIG. 2. One head assembly 11 includes a plurality of nozzle spindles 40 installed in a circular orientation about a spline shaft 35. A nozzle holder 50 is coupled to the spline shaft 35. The nozzle spindles 40 are disposed to move up and down in the same circle about the spline shaft 35 of the nozzle holder 50.

The spline shaft 35 rotates according to the operation of a nozzle rotating mechanism 60, which generally acts as a nozzle rotating motor, and accordingly, the nozzle spindles 40 and the nozzle holder 50 coupled to the spline shaft 35 rotate.

In the meantime, to individually select and lower one of the nozzle spindles 40, the nozzle selecting mechanism 70 and the nozzle lifting mechanism 80 are disposed on the head assembly 11. The nozzle selecting mechanism 70 includes a compressed air supply chamber 71 and a nozzle selecting valve 72 for controlling the injection of compressed air into a pressurized air supply chamber 32 corresponding to a selected nozzle spindle 40. Here, the pressurized air supply chamber 32 is a space formed inside an air cylinder block 30 that is coupled to the head assembly 11 and disposed on the nozzle holder 50, and can be connected to each of the nozzle spindles 40.

Accordingly, if air under positive pressure is introduced into the pressurized air supply chamber 32 disposed on the selected nozzle spindle 40, a piston 52 formed in the pressurized air supply chamber 32 and an air cylinder shaft 53 coupled under the piston 52 are lowered, such that a lower end 53a of the air cylinder shaft 53, an upper end 50a of the selected nozzle spindle 40 attached to the lower end 53a, and a top surface 85a of a stepped portion of a spline nut 85 are positioned at the same level, resulting in making the air cylinder shaft 53, the nozzle spindle 40, and the spline nut 85 integrated into one body. Here, the spline nut 85 is coupled to the nozzle lifting mechanism 80 including a cam follower 84, an eccentric cam 82, and a driving motor 81, such that the spline nut 85 can vertically move. Thus, the nozzle spindle 40 coupled to the spline nut 85 can be lowered.

Further, a vacuum suction unit 90 helps the nozzle spindles 40 to pick up electronic components. The vacuum suction unit 90 causes air under negative pressure from a negative pressure air supply chamber 91 to be individually provided into the nozzle spindles 40 by picking up-and-mounting valves 92 installed outside the nozzle holder 50, such that the nozzle spindles 40 can individually pick up the electronic components.

As can be appreciated from the foregoing, revolving head assemblies have a small size and can mount a plurality of electronic components. However, the conventional head assembly 11 for the component mounter employs the nozzle lifting mechanism 80 including the eccentric cam 82, the cam follower 84, and the spline nut 85 to lower the nozzle spindles 40, thereby resulting in a complex lifting mechanism and a low mounting speed.

Furthermore, since the number of air cylinder shafts 53 directly corresponds with the number of nozzle spindles 40, the size of the head assembly 11 is increased so that it may be difficult to pick up and mount a plurality of components simultaneously, thereby decreasing a mounting speed of the assembly 11.

Moreover, since the head assembly 11, which includes the eccentric cam 82, the cam follower 84, and the spline nut 85, employs a number of picking up-and-mounting valves 92 in direct correspondence with the number of nozzle spindles 40, the total weight of the head assembly 11 is increased, and the head assembly 11 occupies a considerable space so that the assembly 11 may be difficult to be applied to various work conditions.

SUMMARY OF THE INVENTION

The present invention provides a head assembly for a component mounter, which includes a plurality of revolving nozzle spindles for simultaneously picking up and mounting two or more electronic components.

The present invention also provides a head assembly that increases a mounting speed for a component mounter, the head assembly including: a nozzle lifting mechanism for lowering one or more of a plurality of nozzle spindles; a rotary housing mechanism for rotating the plurality of nozzle spindles about a common axis; and a nozzle rotation mechanism for rotating each of the plurality of nozzle spindles on its own axis.

The present invention also provides a head assembly for a component mounter, which includes fewer components to reduce a total weight and can be used as a module.

According to an aspect of the present invention, there is provided a head assembly for a component mounter, the head assembly comprising a base frame, a rotary housing, a plurality of nozzle spindles, a housing rotating mechanism, and a nozzle lifting mechanism.

The rotary housing is rotatably mounted on the base frame and has spindle receiving holes vertically formed at regular intervals at the same radius from a center thereof. Each spindle of the plurality of nozzle spindles includes a lower end having a nozzle for picking up electronic components. Each spindle is received in a spindle receiving hole such that the plurality of nozzle spindles has a circular arrangement and rotates about a common central axis when the rotary housing rotates. The housing rotating mechanism rotates the rotary housing. The nozzle lifting mechanism includes a nozzle lift driving unit, and a clutch part that moves according to the operation of the nozzle lift driving unit and can simultaneously press down and lower the plurality of nozzle spindles.

The clutch part may be operable to lower one or more of the plurality of nozzle spindles.

The clutch part may comprise: a clutch shaft moving up and down according to the operation of the nozzle lift driving unit; and a clutch plate disposed at one end of the clutch shaft and having a size for at least pressing down two adjacent nozzle spindles simultaneously and pressing down only one nozzle spindle.

The head assembly may further comprise a nozzle rotating mechanism that rotates each of the nozzle spindles on its own lengthwise axis, wherein the nozzle rotating mechanism comprises: a nozzle rotation driving unit mounted on the base frame; a nozzle driving gear connected to the nozzle rotation driving unit; and nozzle driven gears fitted around outer circumferences of the nozzle spindles and connected to the nozzle driving gear such that the nozzle driven gears rotate when the nozzle driving gear rotates. The nozzle rotating mechanism may further comprise a ring gear rotating relative to the rotary housing, wherein the ring gear has an outer circumferential surface having an outer gear part that engages with the nozzle driving gear, and an inner circumferential surface having an inner gear part that engages with each of the nozzle driven gears.

According to another aspect of the present invention, there is provided a head assembly for a component mounter, the head assembly comprising a base frame, a rotary housing, a plurality of nozzle spindles, a nozzle rotation driving unit, a nozzle driving gear, nozzle driven gears, and a ring gear.

The rotary housing is rotatably mounted on the base frame and has spindle receiving holes vertically formed at a predetermined arcuate spacing about a common circumference. The plurality of nozzle spindles include lower ends having nozzles for picking up electronic components, and the spindles are disposed in the spindle receiving holes for picking up and mounting the electronic components. The nozzle rotation driving unit is mounted on the base frame. The nozzle driving gear is connected to the nozzle rotation driving unit.

The nozzle driven gears are fitted around outer circumferences of the nozzle spindles. The ring gear rotates relative to the rotary housing and includes an outer circumferential surface having an outer gear part that engages with the nozzle driving gear, and an inner circumferential surface having an inner gear part that engages with each of the nozzle driven gears.

According to still another aspect of the present invention, there is provided a head assembly for a component mounter, the head assembly comprising: a base frame; a rotary housing rotatably mounted on the base frame and having spindle receiving holes vertically formed at regular intervals at the same radius from a center thereof; a plurality of vertically movable nozzle spindles, each including a first end having a nozzle for picking up electronic components, the spindles received in the spindle receiving holes such that the plurality of nozzle spindles rotate about a common central axis when the rotary housing rotates; and a housing rotating mechanism including a housing rotation driving unit mounted on the base frame, a housing driving gear connected to the housing rotation driving unit, and a housing driven gear mounted on the rotary housing and rotating in connection with the housing driving gear, the housing rotating mechanism adapted to rotate the rotary housing.

According to yet another aspect of the present invention, there is provided a head assembly for a component mounter, the head assembly comprising: a base frame; a rotary housing rotatably mounted on the base frame and having spindle receiving holes vertically formed therein at a regular spacing at the same radius from a center thereof; a plurality of nozzle spindles received in the spindle receiving holes such that the nozzle spindles revolve about the center thereof when the rotary housing rotates, and each spindle including a first end having a nozzle for picking up electronic components; a housing rotating mechanism including a housing rotation driving unit and a gear assembly comprising a plurality of gears that rotate according to the operation of the housing rotation driving unit for rotating the rotary housing; a nozzle rotating mechanism including a nozzle rotation driving unit mounted on the base frame and a gear assembly composed of a plurality of gears that rotate according to the operation of the nozzle rotation driving unit for rotating each of the nozzle spindles on it own lengthwise axis; and a nozzle lifting mechanism including a nozzle lift driving unit coupled to an upper portion of the rotary housing of the base frame, and a clutch part vertically moving according to the operation of the nozzle lift driving unit to selectively press down and lower one or a plurality of nozzle spindles.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which various embodiments of the invention are shown.

Figure 1:
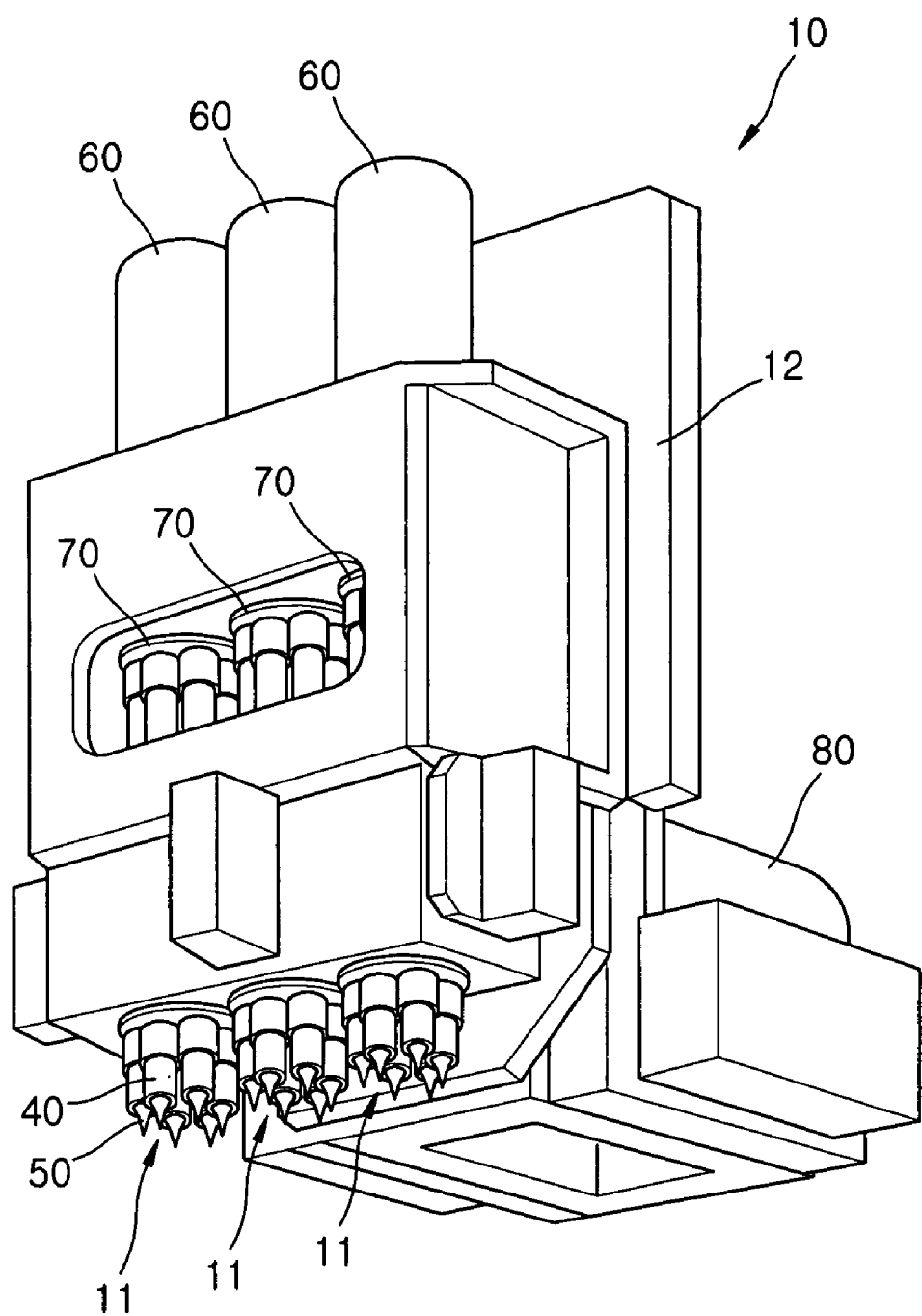
FIG. 1 is a perspective view of a conventional component mounter.
Figure 2:
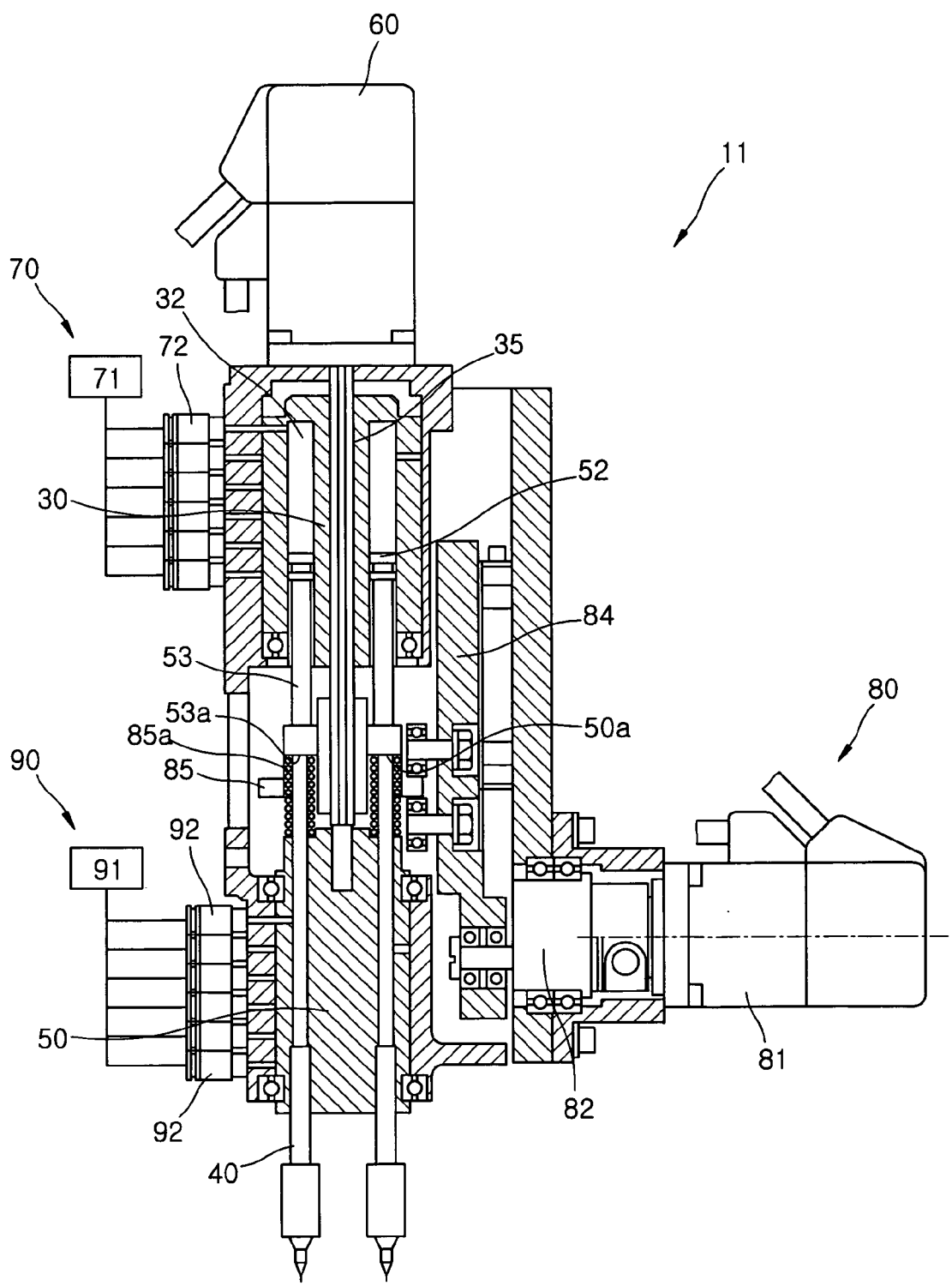
FIG. 2 is a sectional view of one head assembly disposed on the component mounter shown in FIG. 1.
Figure 3:
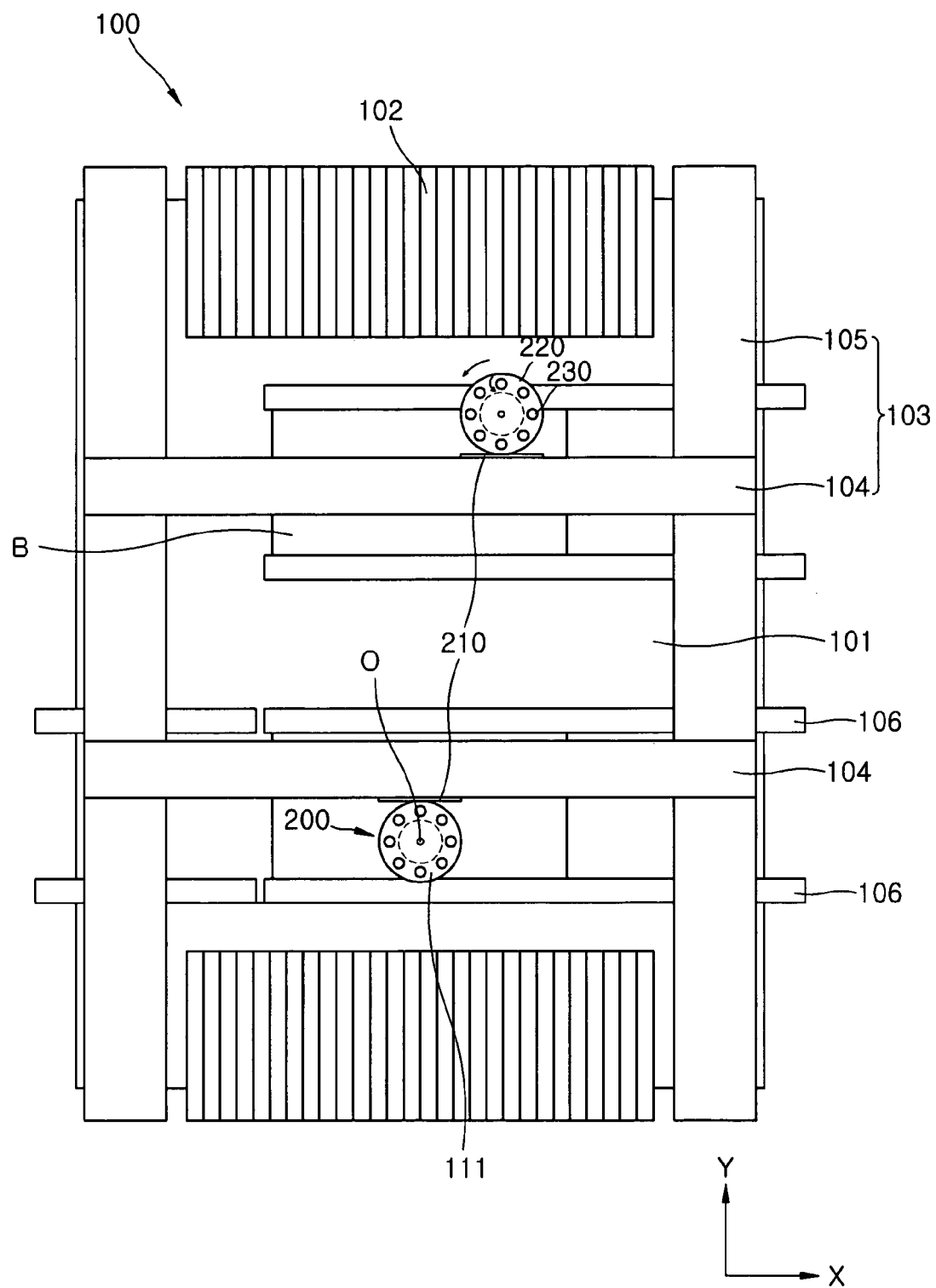
FIG. 3 is a plan view of a component mounter including a head assembly according to an embodiment of the present invention.
Figure 4:
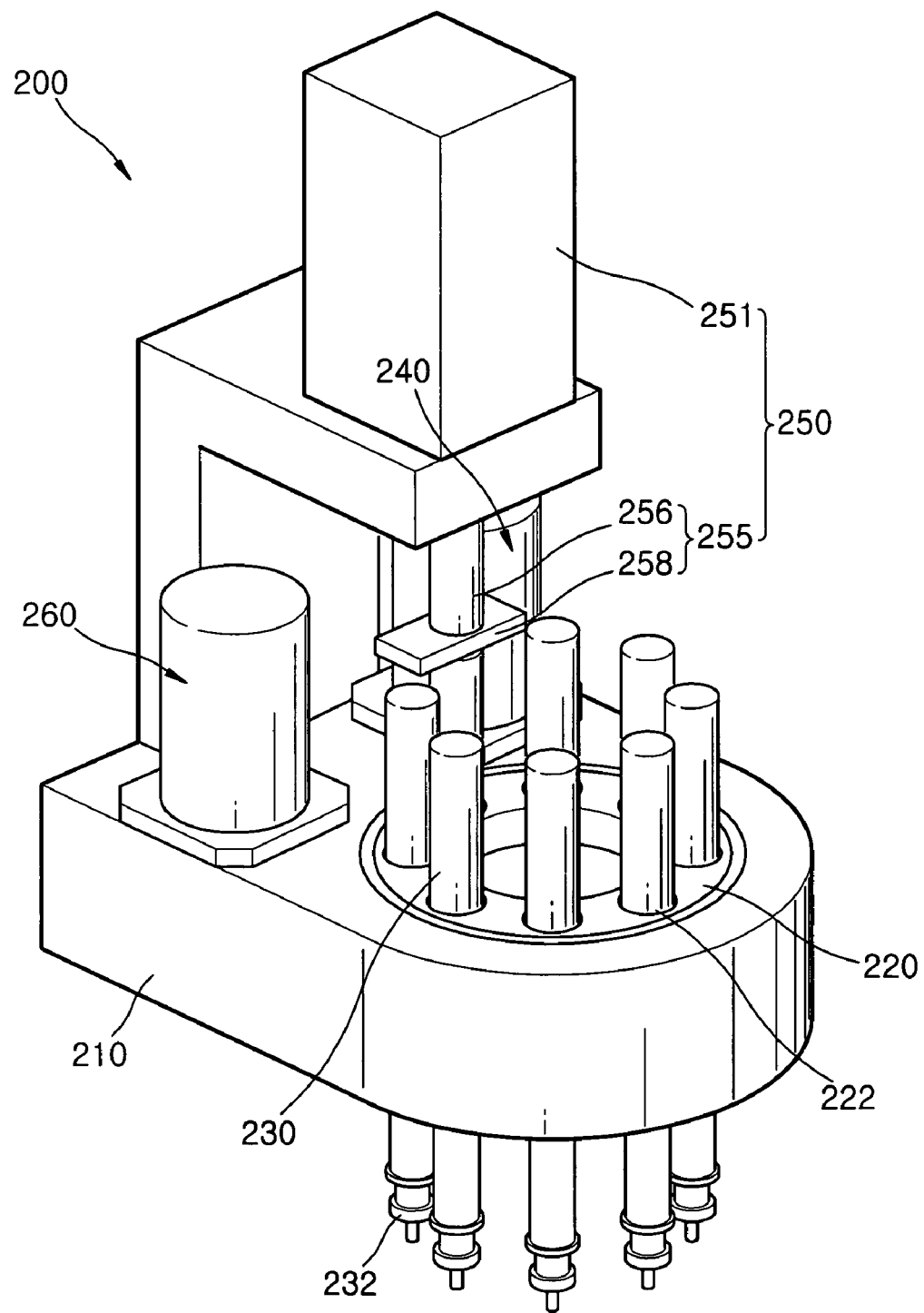
FIG. 4 is a perspective view the head assembly of the component mounter shown in FIG. 3.

FIG. 3 is a plan view of a component mounter including a head assembly according to an embodiment of the present invention. FIG. 4 is a perspective view of the head assembly shown in FIG. 3. Referring to FIGS. 3 and 4, a component mounter 100 includes head assemblies 200, a bed 101, and horizontally moving mechanisms 103. The bed 101 may include a component supplying part 102 which supplies electronic components, and a conveyor part 106 which feeds a printed circuit board B in an X-axis direction. Here, each of the head assemblies 200 for the component mounter 100 includes a plurality of nozzle spindles, each spindle having a first end on which a nozzle is installed, for picking up the electronic components resting on the component supplying part 102 and mounting the picked-up components on the printed circuit board B.

The horizontally moving mechanisms 103 are coupled to the bed 101. The horizontally moving mechanisms 103 horizontally move the plurality of head assemblies 200 (i.e., the mechanisms 103 move each of the assemblies 200 in the X and Y directions) generally between component pickup positions of the component supplying parts 102 and various positions on the printed circuit board B.

Each of the horizontally moving mechanisms 103 may include an X-axis moving mechanism 104 horizontally moving the head assembly 200 in the X-axis, and a Y-axis moving mechanism 105 horizontally moving the head assembly 200 in the Y-axis. For example, as known in the art, the X-axis and Y-axis moving mechanisms 104, 105 may be linear servomotors or the like.

In this case, the head assemblies 200 may be coupled to the X-axis moving mechanisms 104 such that the head assemblies 200 can horizontally move along the X-axis moving mechanisms 104. Here, the X-axis moving mechanisms 104 are mounted on the Y-axis moving mechanisms 105 to horizontally move, such that both ends of each of the X-axis moving mechanisms 104 intersect the Y-axis moving mechanisms 105 at right angles. Accordingly, if the X-axis moving mechanisms 104 move along the Y-axis moving mechanisms 105, the head assemblies 200 mounted on the X-axis moving mechanisms 104 horizontally move in the Y-axis. Also, the head assemblies 200 horizontally move in the X-axis along the X-axis moving mechanisms 104. The foregoing described coupling of the assemblies 200 to the mechanism 104, 105 is exemplary and may be otherwise so long as the assemblies 200 move along the X-Y plane.

As best illustrated in FIG. 4, each of the head assemblies 200 includes a base frame 210, a rotary housing 220, and a plurality of nozzle spindles 230. The base frame 210, which horizontally moves when the X-axis moving mechanism 104 and the Y-axis moving mechanism 105 move, is generally coupled to the X-axis moving mechanism 104. The rotary housing 220 is coupled to the base frame 210 and is rotated therein by a housing rotating mechanism 240.

Spindle receiving holes 222 are formed vertically in the housing 220 and are spaced arcuately thereabout at regular intervals at the same radius from a center O (FIG. 5B) of the rotary housing 220. The nozzle spindles 230 are disposed in the spindle receiving holes 222. As shown in FIG. 4, there are eight spindles 230 disposed in the eight holes 222 so that adjacent spindles 230 are arcuately spaced apart by forty-five degrees. Fewer or additional holes 222 and/or spindles 230 may be provided as desired for a particular component mounting process.

Nozzles 232 are disposed at lower portions of the nozzle spindles 230. The nozzles 232 move downward when disposed over the component supplying part 102 to pick up electronic components. The nozzles 232 then move upward, horizontally move, and move downward again when disposed over the printed circuit board B to mount the picked-up electronic components on the board B.

Accordingly, the nozzle spindles 230 move vertically to lower and raise the nozzles 232. To this end, as shown in FIG. 4, a nozzle lifting mechanism 250 is disposed on the head assembly 200. The nozzle lifting mechanism 250 may include a nozzle lift driving unit 251 and a clutch part 255. The clutch part 255 is coupled to the nozzle lift driving unit 251, which may include a motor such as a voice coil motor (VCM) or the like, such that the clutch part 255 can move down to either lower one nozzle spindle 230 or simultaneously lower more than one nozzle spindles. Indeed, although the clutch part 255 is illustrated and described herein as moving one or two nozzle spindles 230, the clutch part 255 may be sized and shaped otherwise to simultaneously or sequentially lower two or more of the plurality of spindles 230 for mounting a plurality of electronic components on the printed circuit board B.

The clutch part 255 may include a clutch shaft 256 and a clutch plate 258 that are coupled together, but the shaft 245 and plate 258 may be integrally formed. The clutch shaft 256 vertically moves according to the operation of the nozzle lift driving unit 251. The clutch plate 258 is disposed at one end of the clutch shaft 256 (e.g., the lower end as illustrated), and has a flat shape to press down either one nozzle spindle 230 or two adjacent nozzle spindles 230 based on the rotational orientation of the rotary housing 220 relative to the shaft 256 as will be explained in further detail hereafter.

As further illustrated in FIG. 4, the head assembly 200 includes a housing rotating mechanism 240. The rotary housing 220 is rotated by the housing rotating mechanism 240 and the nozzle spindles 230 disposed in the rotary housing 220 accordingly revolve about a common vertical central axis (O in FIGS. 5B, 6B). Thus, for example, after one nozzle spindle 230 picks up an electronic component, the rotary housing 220 is revolved through a predetermined angle by the housing rotating mechanism 240 so that one or more other nozzle spindles 230 are positioned over the component supplying part 102 to pick up electronic components, thereby enabling all the nozzle spindles 230 to pick up electronic components so that number of trips that the spindles make between the supplying part 102 and the PCB is minimized.

Further, the head assembly 200 includes a nozzle rotating mechanism 260 that rotates each of the nozzle spindles 230 on its own lengthwise (i.e., vertical) axis. As the nozzle spindle 230 is rotated by the nozzle rotating mechanism 260, the nozzle spindle 230 can mount the electronic component on the most accurate position and most accurate orientation (e.g., rotation) on the printed circuit board B, which will be explained later.

Figure 5A:
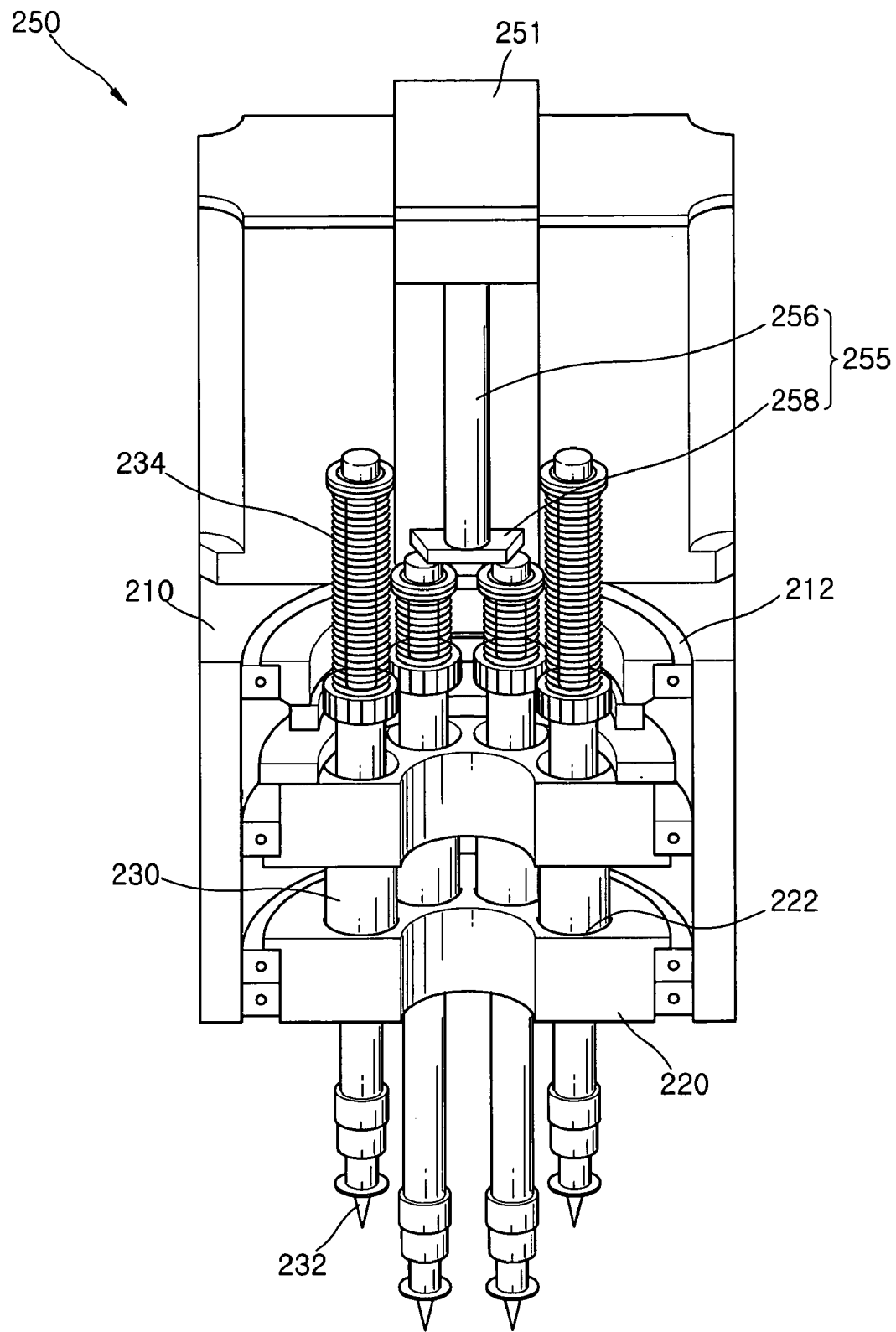
FIG. 5A is a perspective view of a nozzle lifting mechanism used to simultaneously lower two nozzle spindles in the head assembly shown in FIG. 4.
Figure 5B:
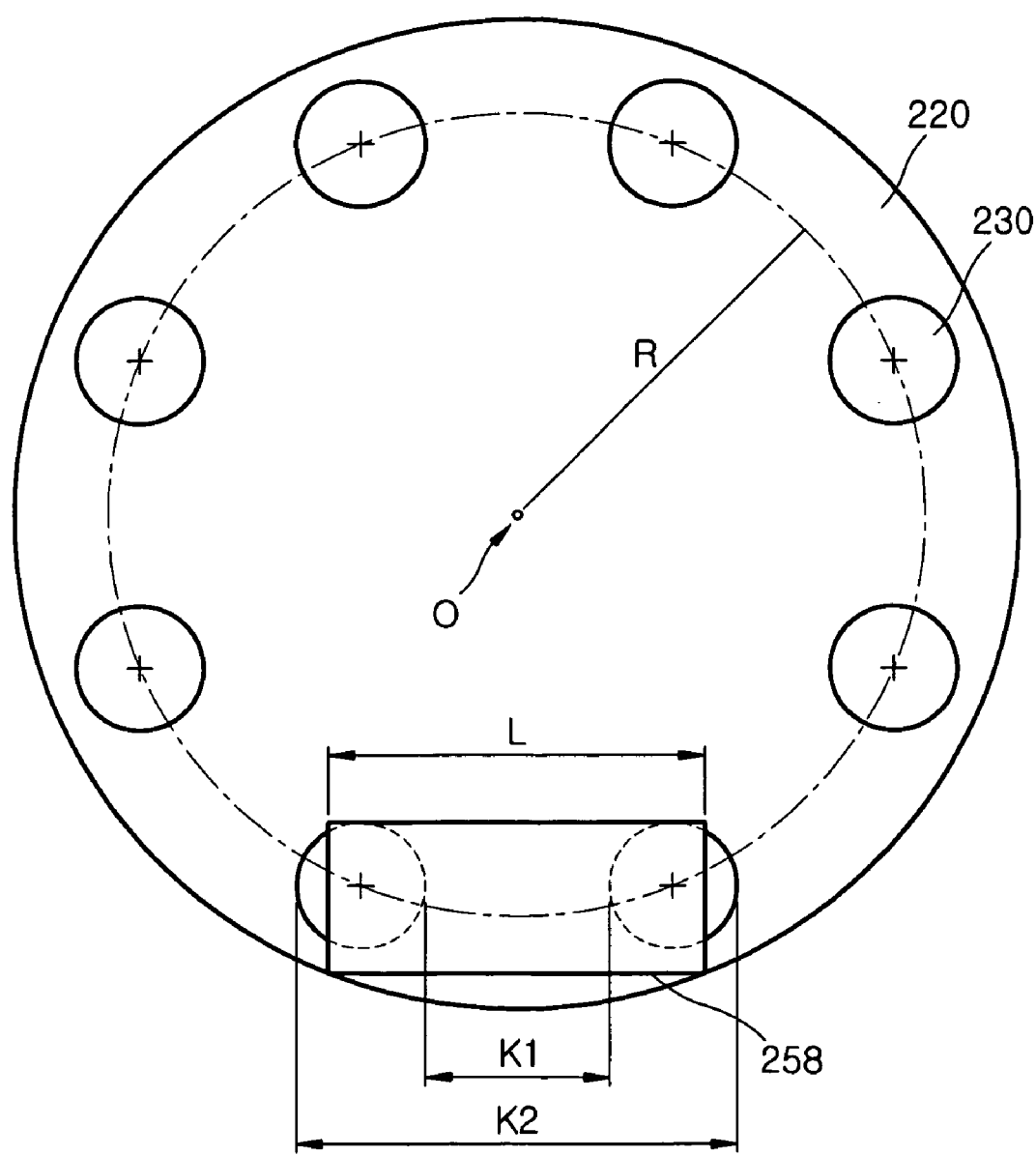
FIG. 5B is a plan view illustrating arrangements of the nozzle spindles and a clutch plate of the nozzle lifting mechanism shown in FIG. 5A.

The nozzle lifting mechanism 250 will be explained with reference to FIGS. 5A through 6B. FIGS. 5A and 5B illustrate arrangements of the nozzle spindles 230 of the nozzle lifting mechanism 250 when the clutch plate 258 simultaneously lower two adjacent nozzle spindles. Referring to FIGS. 5A and 5B, the nozzle lift driving unit 251 is mounted on the base frame 210 over the rotary housing 220. The clutch part 255 is coupled to the nozzle lift driving unit 251 and is interposed between the nozzle lift driving unit 251 and the nozzle spindles 230 so that the spindles 230 move up and down according to the operation of the nozzle lift driving unit 251.

The rotary housing 220 is disposed under the clutch part 255. As best illustrated in FIG. 5B, the plurality of spindle receiving holes 222 are formed at regular intervals (i.e., forty-five degrees apart) at the same radius R from the center O of the rotary housing 220. The nozzle spindles 230 are received in the spindle receiving holes 222 such that each of the nozzle spindles 230 can rotate on its own lengthwise vertical axis (generally indicated by the + sign in the center of each spindle 230). The rotary housing 220 is rotated by the housing rotating mechanism 240 (see FIG. 4), and the nozzle spindles 230 connected to the rotary housing 220 accordingly revolve about the central axis O. In this case, a bearing (e.g., a bearing cone or the like) may be disposed between the rotary housing 220 and the base frame 210 as will be described later.

As shown in FIG. 5B, the clutch plate 258 is positioned directly above a circle defined by the centers of the plurality of nozzle spindles 230. Thus, to lower two adjacent nozzle spindles 230, both ends of the clutch plate 258 cooperate to press down the adjacent nozzle spindles 230 such that the two adjacent nozzle spindles 230 are simultaneously lowered as the clutch plate 258 moves down.

As shown in FIG. 5B, the clutch plate 258 may be generally rectangular in shape and have a length L that is greater than a distance K1 between closest ends of the adjacent nozzle spindles 230 and less than a distance K2 between farthest ends of the adjacent nozzle spindles 230 so that the clutch plate 258 has a small size but can simultaneously press down the two adjacent nozzle spindles 230. Accordingly, the housing rotating mechanism 240 rotates the rotary housing 220 to place the two nozzle spindles 230 at half index positions, and then the clutch plate 258 moves down to simultaneously press down and lower the two nozzle spindles 230. Although the clutch plate 258 is shown to be rectangular in FIGS. 4, 5B and 6B, the clutch plate 258 may be shaped otherwise. For example, as shown in FIGS. 5A and 7, the clutch plate 258 may be parallelogram-shaped, an annular-shaped arcuate portion, or the like to provide sufficient contact with the one or more spindles 230 therebelow.

Figure 6A:
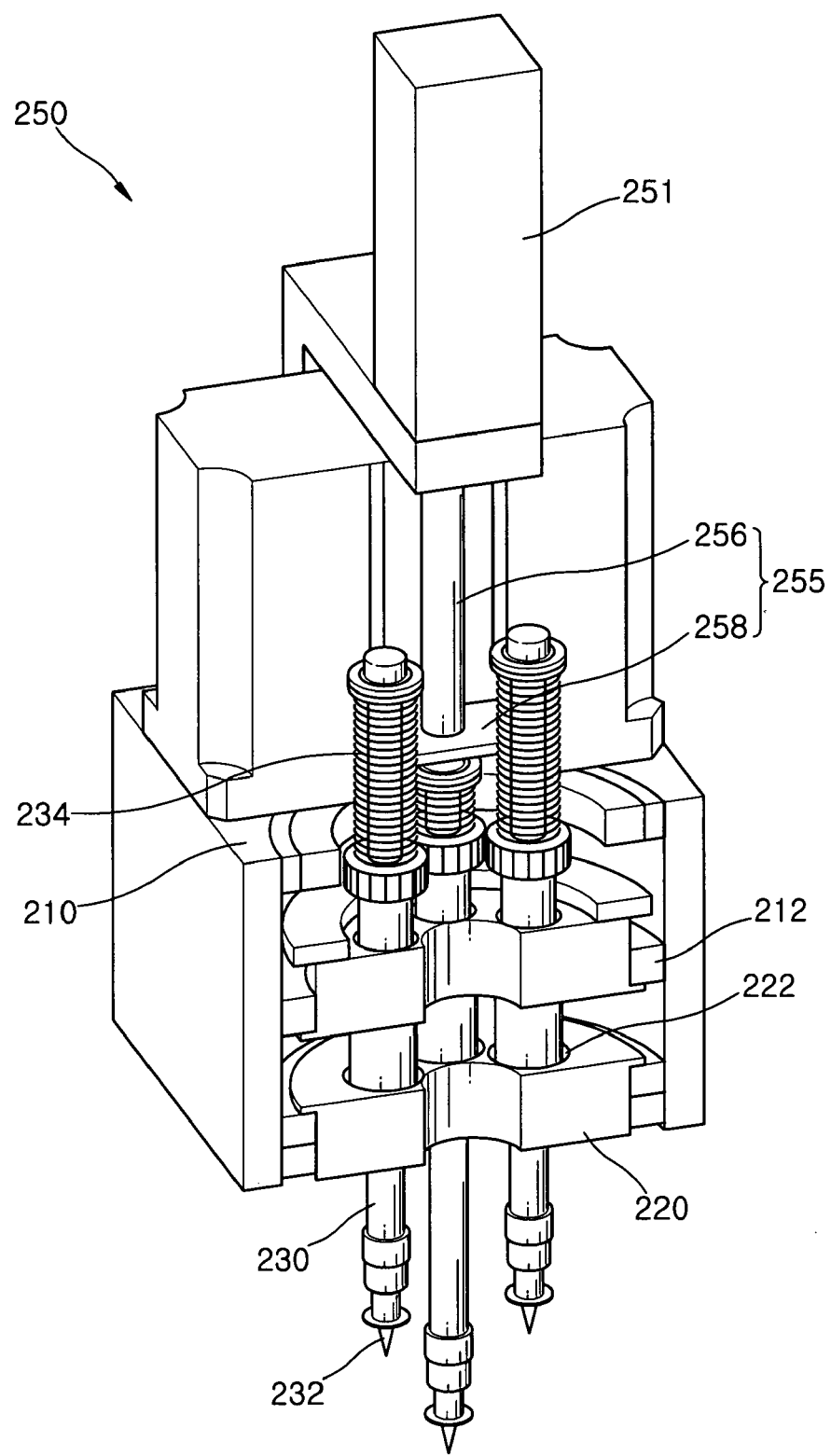
FIG. 6A is a perspective view of the nozzle lifting mechanism used to lower one nozzle spindle in the head assembly shown in FIG. 4.
Figure 6B:
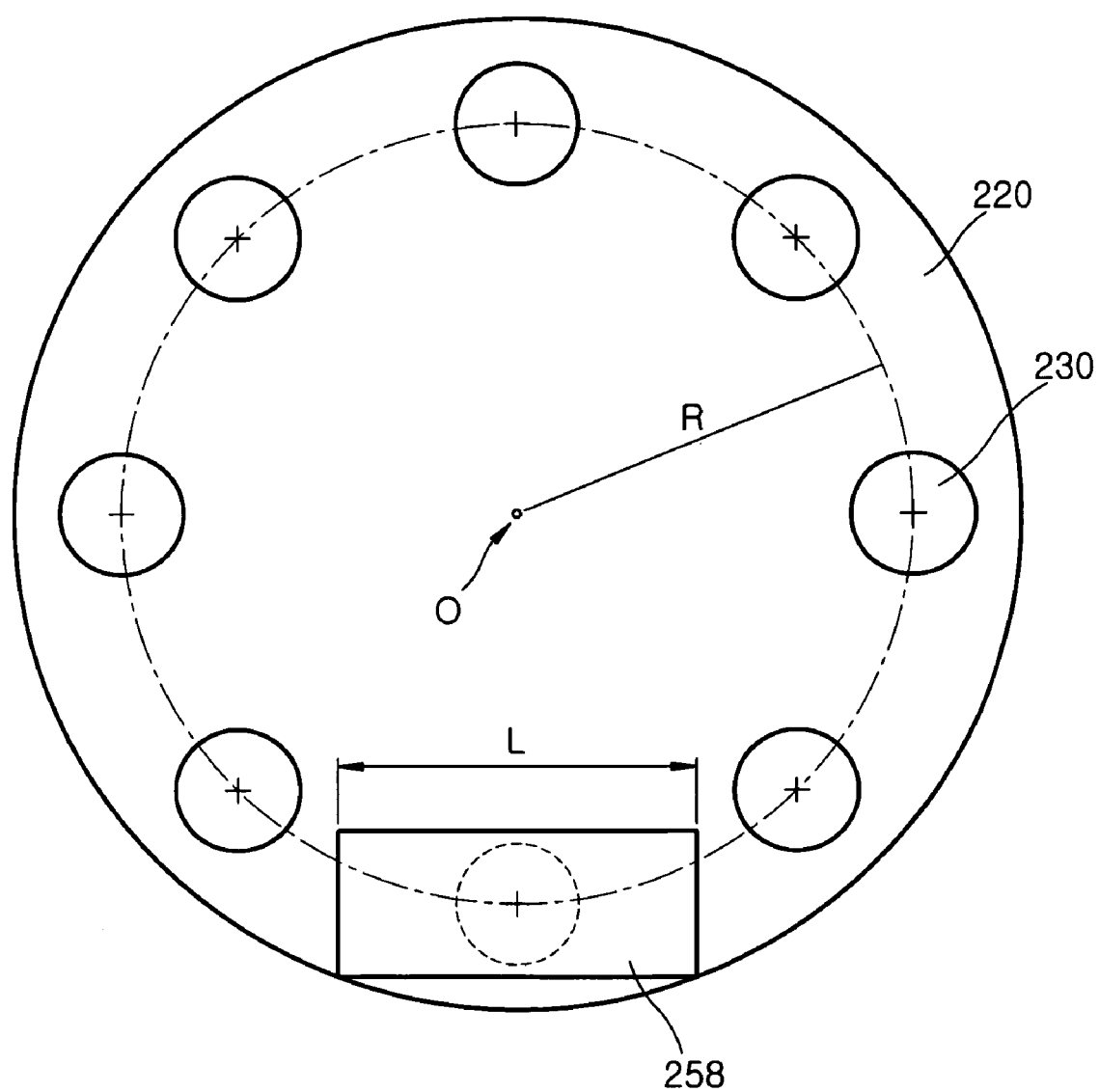
FIG. 6B is a plan view illustrating arrangement of the nozzle spindle and the clutch plate of the nozzle lifting mechanism shown in FIG. 6A.

Further as shown in FIGS. 6A and 6B, for the clutch plate 258 to lower one nozzle spindle 230, the clutch plate 258 should have a length L that is selected so that the clutch plate 258 does not contact other adjacent nozzle spindles when contacting the one nozzle spindle 230. Further, to prevent the clutch plate 258 from depressing more than one spindle 230, the selected nozzle spindle 230 is oriented below a central portion of the clutch plate 258. To this end, the housing rotating mechanism 240 rotates the rotary housing 220 to place the selected one nozzle spindle 230 at a full index position, and then the clutch plate 258 moves down to press down and lower the single, selected nozzle spindle 230.

Accordingly, one clutch plate can simultaneously actuate (i.e., lower) two nozzle spindles as well as a single, selected nozzle spindle as desired without changing the structure of the clutch plate. In addition, since springs 234 can be fitted around outer circumferences of the nozzle spindles 230 so that when the clutch plate 258 does not press down the nozzle spindles 230, the nozzle spindles 230 are lifted and return to their original positions via a spring bias.

Figure 7:
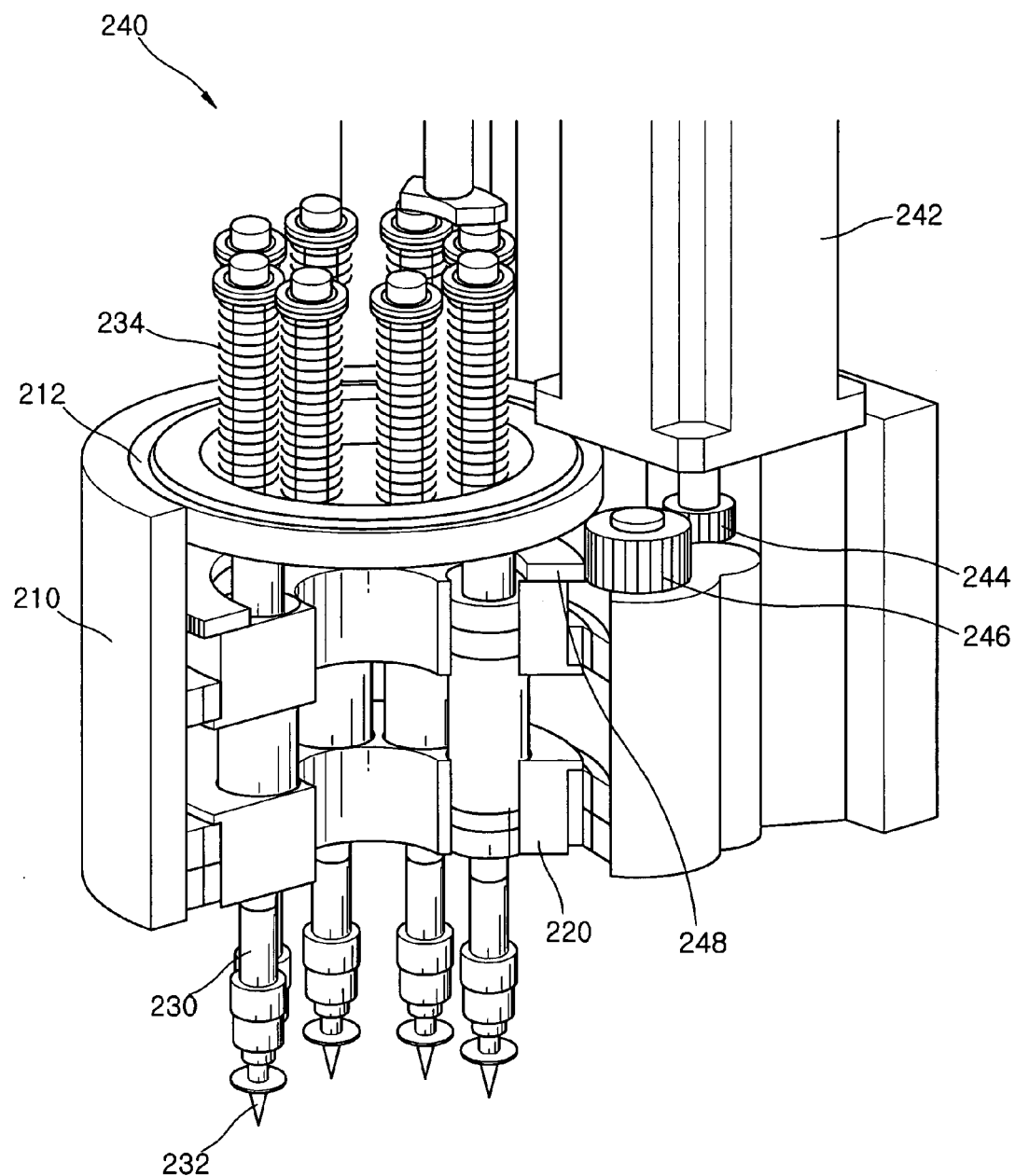
FIG. 7 is a perspective view of a housing rotating mechanism inside the head assembly shown in FIG. 4.
Figure 8:
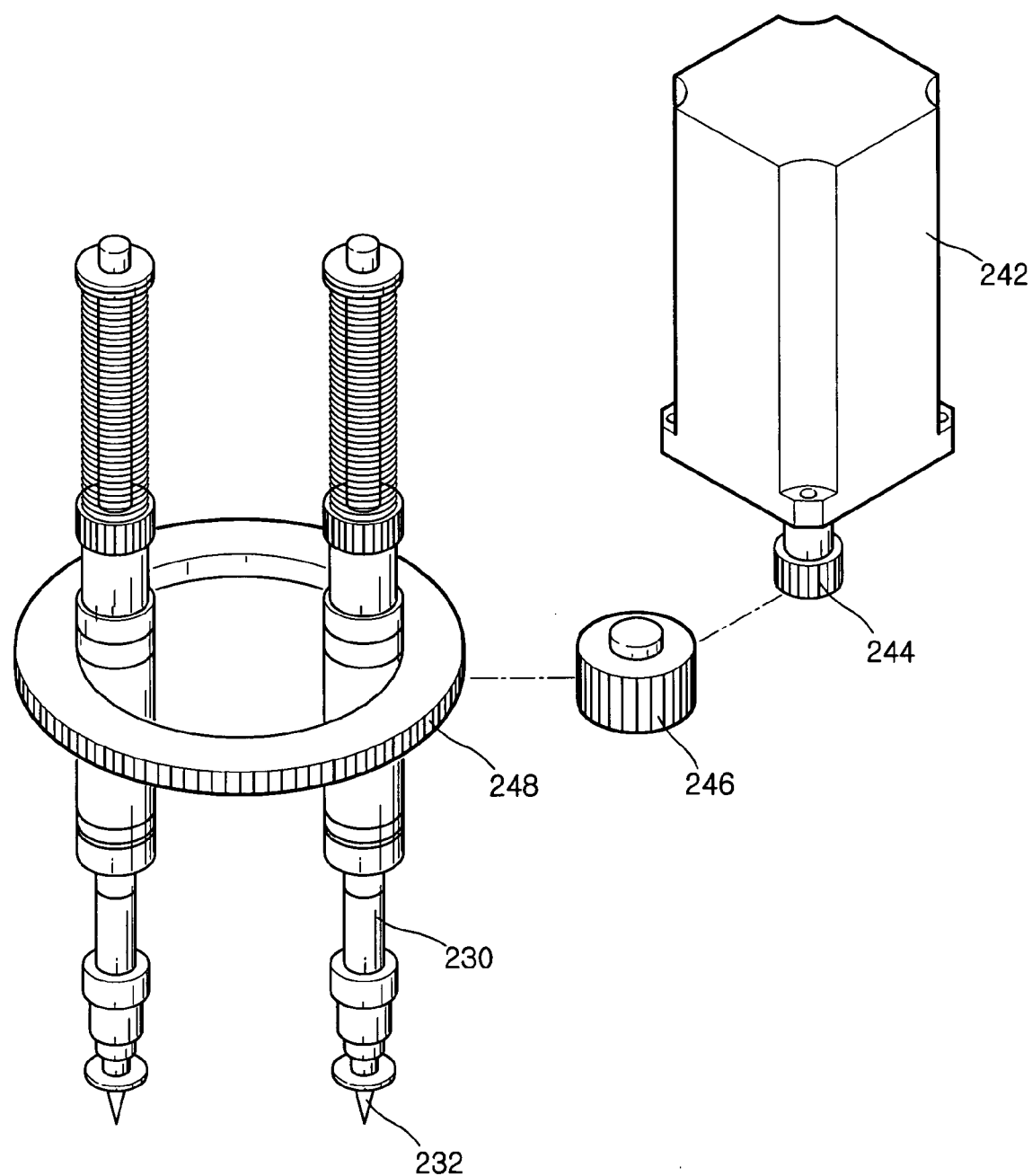
FIG. 8 is an exploded perspective view of the housing rotating mechanism shown in FIG. 7.

Referring now to FIGS. 7 and 8, one can appreciate that the rotary housing 220 can be rotated using a driving motor and a gear assembly driven by the driving motor. As shown, the housing rotating mechanism 240 may include a housing rotation driving unit 242, a housing driving gear 244 and a housing driven gear 248. The housing rotation driving unit 242 (e.g., a motor with a rotating shaft) is mounted on the base frame 210 and the housing driving gear 244 is disposed at one end of the housing rotation driving unit 242. Then, the housing driving gear 244 connected to the housing rotation driving unit 242 rotates accordingly when the housing rotation driving unit 242 rotates.

The housing driven gear 248 is coupled with the rotary housing 220 and rotates in response to the housing driving gear 244. In this case, the housing driven gear 248 may be fitted around an outer circumferential surface of or otherwise coupled with the rotary housing 220.

At least one connecting gear 246 may be disposed between the housing driving gear 244 and the housing driven gear 248. The at least one connecting gear 246 may be selected to minimize the size of the head assembly 200. Alternatively, the at least one connecting gear 246 may be substituted with a belt, chain or other suitable transmission means capable of coupling the gears 244, 248.

To ensure smooth rotation and prevent binding of the rotary housing 220 in the base frame 210 for preventing backlash between the connecting gear 246 and the housing driven gear 248, at least one bearing 212 (e.g., a bearing cone) may be provided and disposed between the rotary housing 220 and the base frame 210.

In the operation of the illustrated housing rotating mechanism 240, if the housing rotation driving unit 242 is driven, the housing driving gear 244 disposed at the one end of the housing rotation driving unit 242 begins to rotate. Accordingly, the at least one connecting gear 246 which engage with the housing driving gear 244 and the housing driven gear 248 which engage with the connecting gear 246 begin to rotate. Since the housing driven gear 248 is coupled to the outer circumference of the rotary housing 220, the rotary housing 220 rotates.

Figure 9:
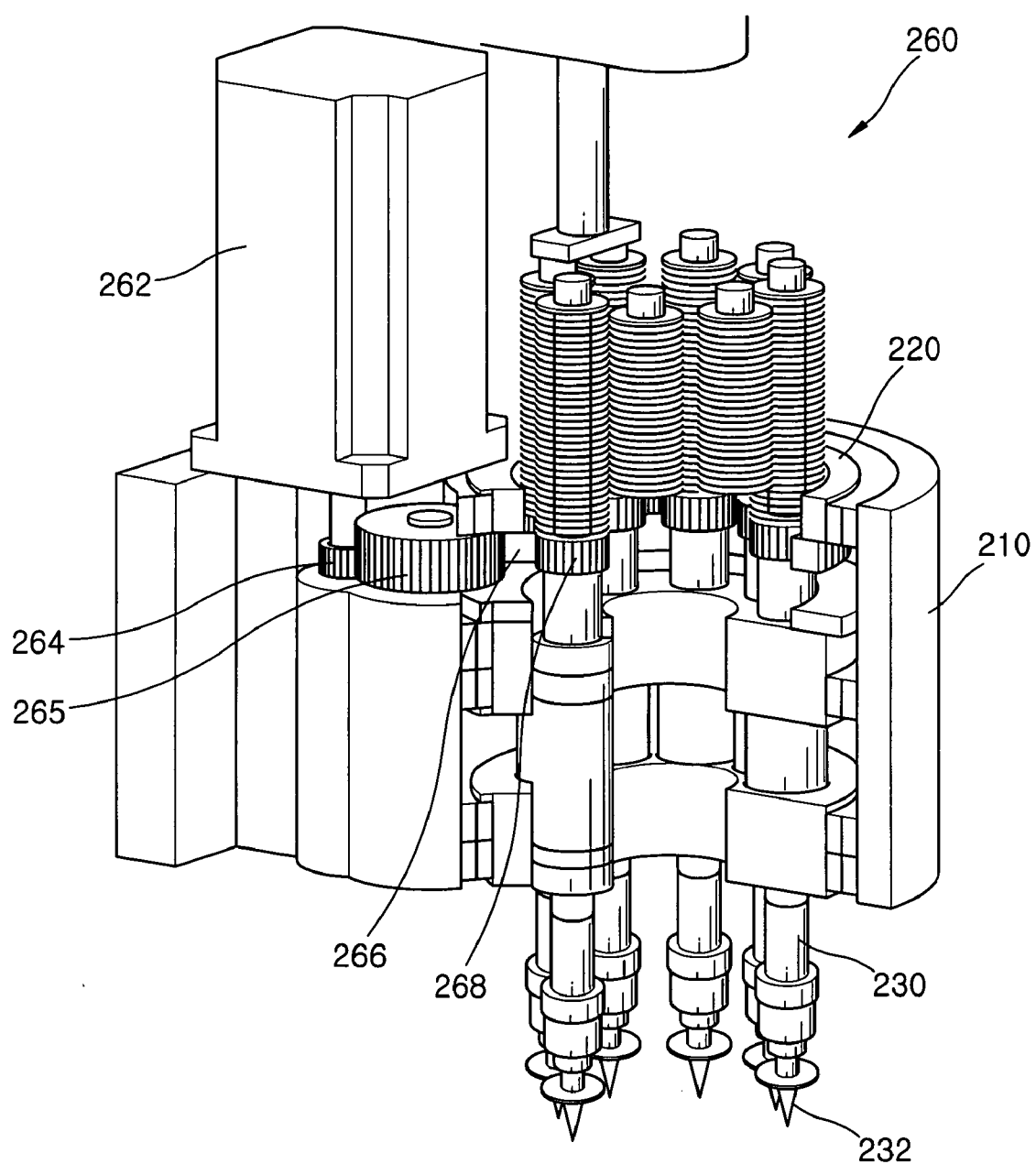
FIG. 9 is a perspective view of a nozzle rotating mechanism inside the head assembly shown in FIG. 4.
Figure 10:
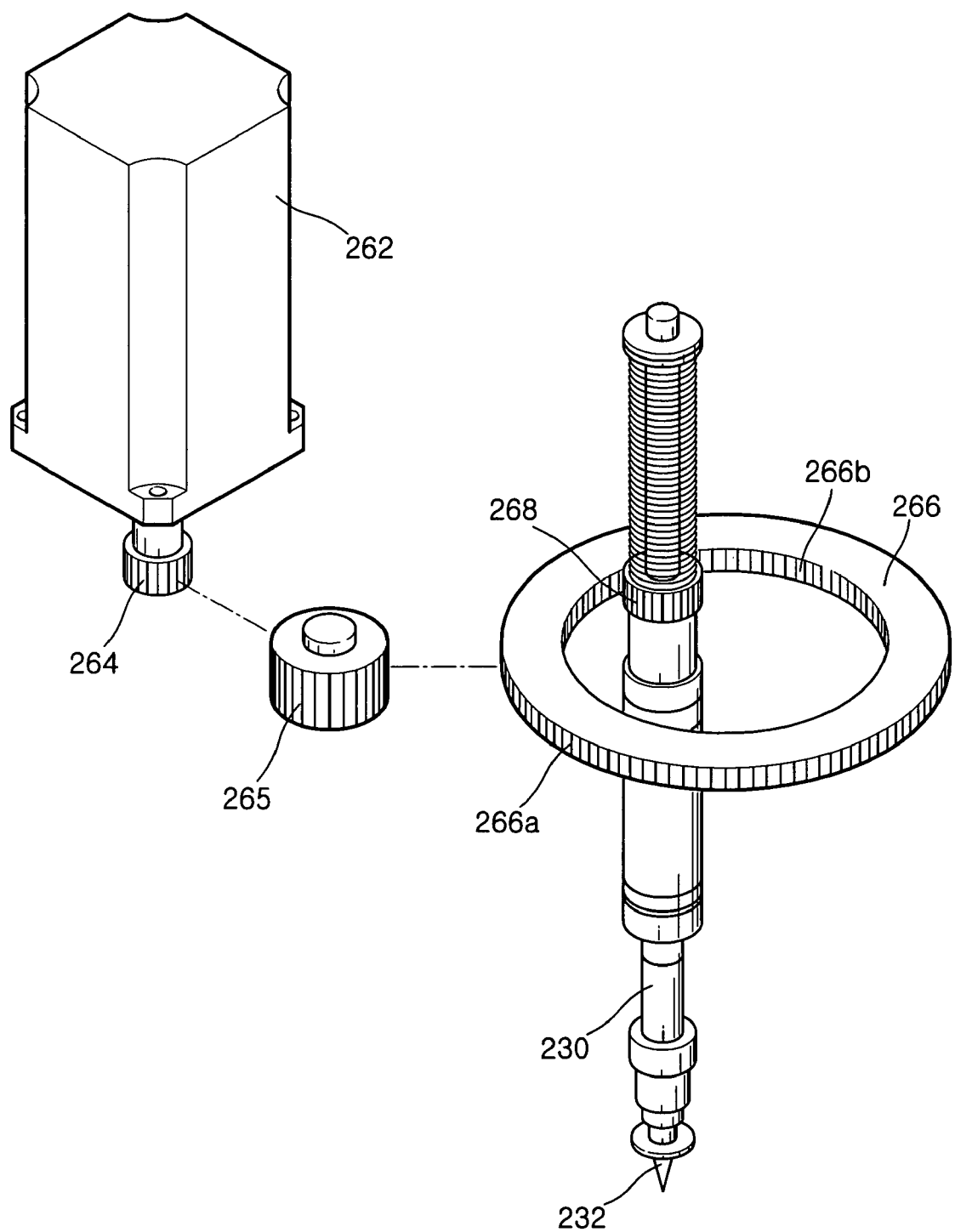
FIG. 10 is an exploded perspective view of the nozzle rotating mechanism shown in FIG. 9.

In addition to the foregoing described rotation of the housing 220 and all of the nozzle spindles 230, each of the nozzle spindles 230 rotates on its own lengthwise vertical axis to mount electronic components at accurate positions. To this end, as shown in FIGS. 9 and 10, the nozzle rotating mechanism 260 may be employed in the head assembly 200.

The nozzle rotating mechanism 260 may comprise a plurality of gears that rotate in response to the operation of the nozzle rotation driving unit 262. That is, the nozzle rotating mechanism 260 basically includes the nozzle rotation driving unit 262 (e.g., a motor with a rotating shaft or the like), a nozzle driving gear 264, and a plurality of nozzle driven gears 268, and may further include a ring gear 266.

Since the nozzle driving gear 264 is disposed at one end of the nozzle rotation driving unit 262 that is typically a driving motor, the nozzle driving gear 264 rotates according to the operation of the nozzle rotation driving unit 262. Also, each of the plurality of nozzle driven gears 268 is fitted around an outer circumferential surface of each of the plurality of nozzle spindles 230.

In one exemplary embodiment, the nozzle driving gear 264 may be positioned at a center of the nozzle driven gears 268 to engage directly with all of the nozzle driven gears 268. Here, if the nozzle driving gear 264 rotates according to the operation of the nozzle rotation driving unit 262, the nozzle driven gears 268 rotate, and as a result, the nozzle spindles 230 rotate.

In the illustrated embodiment of FIGS. 9 and 10, the nozzle driving gear 264 and the nozzle driven gears 268 may be coupled together via the ring gear 266 that can rotate relative to the rotary housing 220. The ring gear 266 has a generally annular shape and may be fitted around the outer circumferential surface of the rotary housing 220. An outer gear part 266a formed on an outer circumferential surface of the ring gear 266 couples with the nozzle driving gear 264 and an inner gear part 266b formed on an inner circumferential surface of the ring gear 266 couples with each of the nozzle driven gears 268.

Here, at least one connecting gear 265 may be employed to couple the ring gear 266 and the nozzle driving gear 264. The number of the connecting gears 265 may be selected to reduce the total size of the head assembly 200. The at least one connecting gear 265 transfers a rotational force of the nozzle driving gear 264 to the ring gear 266. Alternatively, the at least one connecting gear 265 may be substituted with a belt, chain or other suitable transmission means capable of coupling the gears 264, 266.

Here, it is preferable that the nozzle driven gears 268, the ring gear 266, and the connecting gear 265 be structured not to cause backlash among gears engaging therewith.

In the operation of the exemplary illustrated nozzle rotating mechanism 260, the nozzle driving gear 264 disposed at the one end of the nozzle rotation driving unit 262 and the connecting gear 265 engaging with the nozzle driving gear 264 rotate according to the operation of the nozzle rotation driving unit 262. Accordingly, the ring gear 266 having the outer gear part 266a engaging with the connecting gear 265 rotates, and as a result, the nozzle driven gears 268 rotates by engaging with the inner gear part 266b of the ring gear 266. Since the nozzle driven gears 268 may be fixed to the outer circumferential surfaces of the nozzle spindles 230, the nozzle spindles 230 rotate as well.

According to the various embodiments discussed herein, one can appreciate that a plurality of components can be simultaneously picked up thereby increasing a mounting speed.

Furthermore, since in the various embodiments the nozzle spindles are lowered using the clutch shaft and the clutch plate, one can appreciate that the head assembly simplifies lowering and raising of the nozzle spindles, thereby reducing manufacturing costs and the total size of the head assembly.

Moreover, since the nozzle spindles rotate about a common axis and each spindle rotates on its own axis, the various embodiments of the head assembly provide for adjustment of the rotation and placement location for the picked-up components, thereby improving the quality of the PCB products made by the component mounter.

In addition, the weight and size are reduced of the various embodiments of the head assembly since the embodiments discussed herein are not pneumatic including a plurality of valves, nozzle plates and the like that are typically attached to the outside of the head assembly for lowering and raising of the nozzle spindles. Further, the total size is reduced for the various embodiments of the head assembly so that the head assembly can be adapted for use with various component mounters as a head assembly module.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A head assembly for a component mounter, the head assembly comprising:
   a base frame;
   a rotary housing rotatably mounted on the base frame, the rotary housing including a plurality of vertical holes therethrough;
   a plurality of nozzle spindles disposed in the vertical holes, each spindle of the plurality including a lower end having a nozzle for picking up electronic components, the plurality of nozzle spindles rotating about a central axis in response to rotation of the rotary housing;
   a housing rotating mechanism for rotating the rotary housing;
   a nozzle lifting mechanism including a nozzle driving unit and a clutch part that moves in response to the nozzle driving unit for simultaneously lowering more than one nozzle spindle of the plurality of nozzle spindles; wherein the clutch part comprises:
   a clutch shaft that moves up and down in response to the nozzle driving unit; and
   a clutch plate disposed at an end of the clutch shaft and having a surface area that is adapted to simultaneously contact two adjacent nozzle spindles when the rotary housing is oriented at a half index position and contact only one nozzle spindle when the rotary housing is oriented at a full index position.

2. The head assembly of claim 1 wherein the clutch plate has a length that is selected to be greater than a closest distance between two adjacent nozzle spindles.

3. The head assembly of claim 2 wherein the clutch plate is positioned directly above a portion of an annular shape defined by rotation of the plurality of nozzle spindles about the central axis.

4. The head assembly of claim 1, wherein the housing rotating mechanism comprises:
   a housing rotation driving unit mounted on the base frame;
   a housing driving gear connected to the housing rotation driving unit; and
   a housing driven gear coupled with the rotary housing and rotating in response to the housing driving gear.

5. The head assembly of claim 4, further comprising at least one gear interposed between the housing driving gear and the housing driven gear.

6. The head assembly of claim 1, further comprising a nozzle rotating mechanism that rotates each of the plurality of nozzle spindles about a lengthwise vertical axis therethrough, wherein the nozzle rotating mechanism comprises:
   a nozzle rotation driving unit mounted on the base frame;
   a nozzle driving gear connected to the nozzle rotation driving unit; and a plurality of nozzle driven gears, each fitted around an outer circumference of each of the plurality of nozzle spindles such that the nozzle driven gears rotate in response to the nozzle driving gear.

7. The head assembly of claim 6 wherein the nozzle rotating mechanism further comprises a ring gear rotating relative to the rotary housing,
wherein the ring gear includes an outer circumferential surface having an outer gear part that engages with the nozzle driving gear, and an inner circumferential surface having an inner gear part that engages with each of the plurality of nozzle driven gears.

8. The head assembly of claim 7, further comprising at least one gear interposed between the nozzle driving gear and the ring gear.

9. The head assembly of claim 1 further comprising at least one bearing to ensure smooth rotation of the rotary housing relative to the base frame.

10. The head assembly of claim 1 wherein the nozzle driving unit is coupled to an upper portion of the rotary housing so that the clutch part is interposed between the nozzle driving unit and the rotary housing.

11. A head assembly for a component mounter, the head assembly comprising:
a base frame;
a rotary housing rotatably mounted on the base frame, the rotary housing including a plurality of vertical holes therethrough;
a plurality of nozzle spindles disposed in the vertical holes, each spindle of the plurality including a lower end having a nozzle for picking up electronic components, the plurality of nozzle spindles rotating about a central axis in response to rotation of the rotary housing;
a nozzle rotation driving unit mounted on the base frame for rotating each of the plurality of nozzle spindles;
a nozzle driving gear connected to the nozzle rotation driving unit;
a plurality of nozzle driven gears, each fitted around an outer circumference of each of the plurality of nozzle spindles; and
a ring gear rotating relative to the rotary housing and including an outer circumferential surface having an outer gear part that engages with the nozzle driving gear and an inner circumferential surface having an inner gear part that engages with each of the nozzle driven gears.

12. The head assembly of claim 11, further comprising at least one gear interposed between the nozzle driving gear and the ring gear.

13. A head assembly for a component mounter, the head assembly comprising:
a base frame;
a rotary housing rotatably mounted on the base frame, the rotary housing including a plurality of vertical holes therethrough, said holes arcuately spaced about a central axis at a radial distance therefrom;
a plurality of nozzle spindles disposed in the vertical holes, each spindle of the plurality including a nozzle for picking up electronic components; and
a housing rotating mechanism including a housing rotation driving unit mounted on the base frame, a housing driving gear connected to the housing rotation driving unit, and a housing driven gear mounted on the rotary housing, wherein the plurality of nozzle spindles rotates about the central axis in response to operation of the housing rotation driving unit.

14. The head assembly of claim 13, further comprising at least one gear interposed between the housing driving gear and the housing driven gear.

15. The head assembly of claim 13 wherein the rotary housing further comprises at least one bearing to ensure smooth rotation of the rotary housing relative to the base frame.

16. A head assembly for a component mounter, the head assembly comprising:
a base frame;
a spindle receiving means mounted on the base frame and including a rotatable housing having spindle receiving holes vertically formed therein at regular intervals about a center thereof;
a plurality of nozzle spindles disposed in the spindle receiving holes such that the nozzle spindles revolve about the center, each of the plurality of nozzle spindles including an end having a nozzle for picking up and placing electronic components;
a housing rotating means for rotating the spindle receiving means, the housing rotating means including a first gear assembly and a housing rotation driving unit mounted on the base frame and coupled with the first gear assembly;
a nozzle rotating means for rotating each of the plurality of nozzle spindles about a lengthwise vertical axis therethrough, the nozzle rotating means including a second gear assembly and a nozzle rotation driving unit mounted on the base frame and coupled with the second gear assembly; and
a nozzle actuating means for lowering at least one of the plurality of nozzle spindles, the nozzle actuating means including a nozzle driving unit coupled to an upper portion of the base frame and a clutch part at least partially disposed over one of the plurality of nozzle spindles.

17. The head assembly of claim 16 wherein the clutch part comprises:
a clutch shaft that is coupled with the nozzle driving unit; and
a clutch plate disposed at a lower end of the clutch shaft and having a surface area that, relative to an orientation of the rotatable housing, is adapted to at least simultaneously contact two adjacent nozzle spindles and contact only one nozzle spindle.

18. The head assembly of claim 16 wherein the first gear assembly comprises:
a housing driving gear connected to the housing rotation driving unit; and
a housing driven gear mounted on the rotatable housing and coupled with the housing driving gear.

19. The head assembly of claim 16 wherein the second gear assembly comprises:
a nozzle driving gear connected to the nozzle rotation driving unit; and
a plurality of nozzle driven gears, each fitted around an outer circumference of each of the plurality of nozzle spindles and coupled with the nozzle driving gear.

20. The head assembly of claim 19, further comprising a ring gear interposed between the nozzle driving gear and each of the nozzle driven gears,
wherein the ring gear includes an outer circumferential surface having an outer gear part that engages with the nozzle driving gear and an inner circumferential surface having an inner gear part that engages with each of the nozzle driven gears.

* * * * *